US008842030B1

(12) United States Patent
Fontaine et al.

(10) Patent No.: US 8,842,030 B1
(45) Date of Patent: Sep. 23, 2014

(54) SIGMA-DELTA ANALOG TO DIGITAL CONVERTER WITH IMPROVED FEEDBACK

(71) Applicant: Nvidia Corporation, Richardson, TX (US)

(72) Inventors: Paul Fontaine, Richardson, TX (US); Abdellatif Bellaouar, Richardson, TX (US)

(73) Assignee: Nvidia Corporation, Santa Clara, CA (US)

( * ) Notice: Subject to any disclaimer, the term of this patent is extended or adjusted under 35 U.S.C. 154(b) by 0 days.

(21) Appl. No.: 13/891,974

(22) Filed: May 10, 2013

(51) Int. Cl.
H03M 3/00 (2006.01)
(52) U.S. Cl.
CPC .................................. H03M 3/368 (2013.01)
USPC ............................ 341/143; 341/155; 341/144
(58) Field of Classification Search
CPC ............................. H03M 3/30; H03M 3/464
USPC .......... 341/143, 144, 155, 118, 120, 135, 136
See application file for complete search history.

(56) References Cited

U.S. PATENT DOCUMENTS

| | | | | |
|---|---|---|---|---|
| 6,104,330 | A * | 8/2000 | Redman-White et al. | 341/150 |
| 6,605,935 | B2 * | 8/2003 | Nilsson | 324/76.53 |
| 6,714,886 | B2 * | 3/2004 | Sung et al. | 702/107 |
| 7,009,541 | B1 * | 3/2006 | Nguyen | 341/143 |
| 7,372,385 | B2 * | 5/2008 | Yamaji | 341/143 |
| 7,714,757 | B2 * | 5/2010 | Denison et al. | 341/143 |
| 8,493,151 | B2 * | 7/2013 | Kinyua | 330/279 |
| 8,493,251 | B2 * | 7/2013 | Riches | 341/120 |
| 2005/0093732 | A1 | 5/2005 | Clara et al. | |
| 2012/0139764 | A1 | 6/2012 | Sosio et al. | |
| 2013/0027235 | A1 | 1/2013 | Riches | |
| 2013/0214950 | A1 * | 8/2013 | Hojabri et al. | 341/143 |

FOREIGN PATENT DOCUMENTS

DE 10342057 B4 10/2005

OTHER PUBLICATIONS

Foreign Communication from a Related Counterpart Application; German Application No. 10 2013 013 193.6; German Examination Report dated Jan. 23, 2014; 10 pages.

* cited by examiner

Primary Examiner — Peguy Jean Pierre

(57) ABSTRACT

A sigma-delta analog-to-digital converter includes an input transconductance stage that provides an analog input current proportional to an analog input voltage and a current summing stage that generates an analog error signal corresponding to a difference between the analog input current and a feedback current. The sigma-delta analog-to-digital converter also includes a forward signal path that processes the analog error signal to provide a digital output signal corresponding to the analog input voltage. Additionally, the sigma-delta analog-to-digital converter includes a feedback path that includes a current steering digital-to-analog converter having both sourcing and sinking current sources, wherein currents provided by the sourcing and sinking current sources are steerable and connected to directly provide the feedback current based on the digital output signal. A sigma-delta analog-to-digital converter operating method is also provided.

16 Claims, 4 Drawing Sheets

SIGMA-DELTA ANALOG TO DIGITAL CONVERTER WITH IMPROVED FEEDBACK

TECHNICAL FIELD

This application is directed, in general, to analog-to-digital conversion and, more specifically, to a continuous time sigma-delta analog-to-digital converter and a sigma-delta analog-to-digital converter operating method.

BACKGROUND

An analog-to-digital converter (ADC) based on Sigma-Delta operating principles requires at least one feedback digital-to-analog converter (DAC), which is used to cancel most of an ADC input signal. This DAC is the most critical part of the ADC since its output noise, which is directly referred to the ADC input, generally dominates the ADC signal-to-noise ratio (SNR). Additionally, any mismatch with an ADC input stage will typically create gain error.

Transconductance (Gm) may generally be defined as the ratio of a change in an output current due to a change in a corresponding controlling input voltage. High speed Sigma-Delta ADCs usually rely on a continuous time implementation where transconductance-capacitance (Gm/C) integrators are a popular solution for low-voltage and low-noise constrained designs. However, the output noise of a Gm cell is dominated by its quiescent biasing current, while the output signal-dependent current is a small fraction of the biasing current.

Using a Gm cell driven by an output voltage from a DAC to implement the main ADC feedback is a popular and straightforward solution. The same type of Gm cell can be used for the input stage and the feedback DAC, insuring minimum gain error induced by mismatching. However, this approach provides the higher values of resulting Gm quiescent current and therefore higher values of input noise.

SUMMARY

Embodiments of the present disclosure provide a sigma-delta analog-to-digital converter and a sigma-delta analog-to-digital converter operating method.

In one embodiment, the sigma-delta analog-to-digital converter includes an input transconductance stage that provides an analog input current proportional to an analog input voltage and a current summing stage that generates an analog error signal corresponding to a difference between the analog input current and a feedback current. The sigma-delta analog-to-digital converter also includes a forward signal path that processes the analog error signal to provide a digital output signal corresponding to the analog input voltage. Additionally, the sigma-delta analog-to-digital converter includes a feedback path that includes a current steering digital-to-analog converter having both sourcing and sinking current sources, wherein currents provided by the sourcing and sinking current sources are steerable and connected to directly provide the feedback current based on the digital output signal.

In another aspect, the present disclosure provides a sigma-delta analog-to-digital converter operating method. The method includes providing an analog input current proportional to an analog input voltage and generating an analog error signal corresponding to a difference between the analog input current and a feedback current. The method also includes processing the analog error signal to provide a digital output signal corresponding to the analog input voltage. The method additionally includes providing a current steering digital-to-analog converter having both sourcing and sinking current sources, wherein currents from the sourcing and sinking current sources are steerable and connected to directly provide the feedback current based on the digital output signal.

The foregoing has outlined preferred and alternative features of the present disclosure so that those skilled in the art may better understand the detailed description of the disclosure that follows. Additional features of the disclosure will be described hereinafter that form the subject of the claims of the disclosure. Those skilled in the art will appreciate that they can readily use the disclosed conception and specific embodiment as a basis for designing or modifying other structures for carrying out the same purposes of the present disclosure.

BRIEF DESCRIPTION

Reference is now made to the following descriptions taken in conjunction with the accompanying drawings, in which.

DETAILED DESCRIPTION

Embodiments of the present disclosure utilize a current steering DAC that employs both sourcing and sinking current sources (i.e., a sourcing and sinking current steering (SSCS) DAC), which reduces both areas of quiescent current and noise compared to a conventional solution. Additionally, a control loop locks the transconductance (Gm) of an input Gm cell to a target value by forcing its output current to be equal to a reference current. A copy of this reference current is used to bias the SSCS DAC, thereby ensuring a constant gain across process, voltage and temperature variations.

Figure 1:
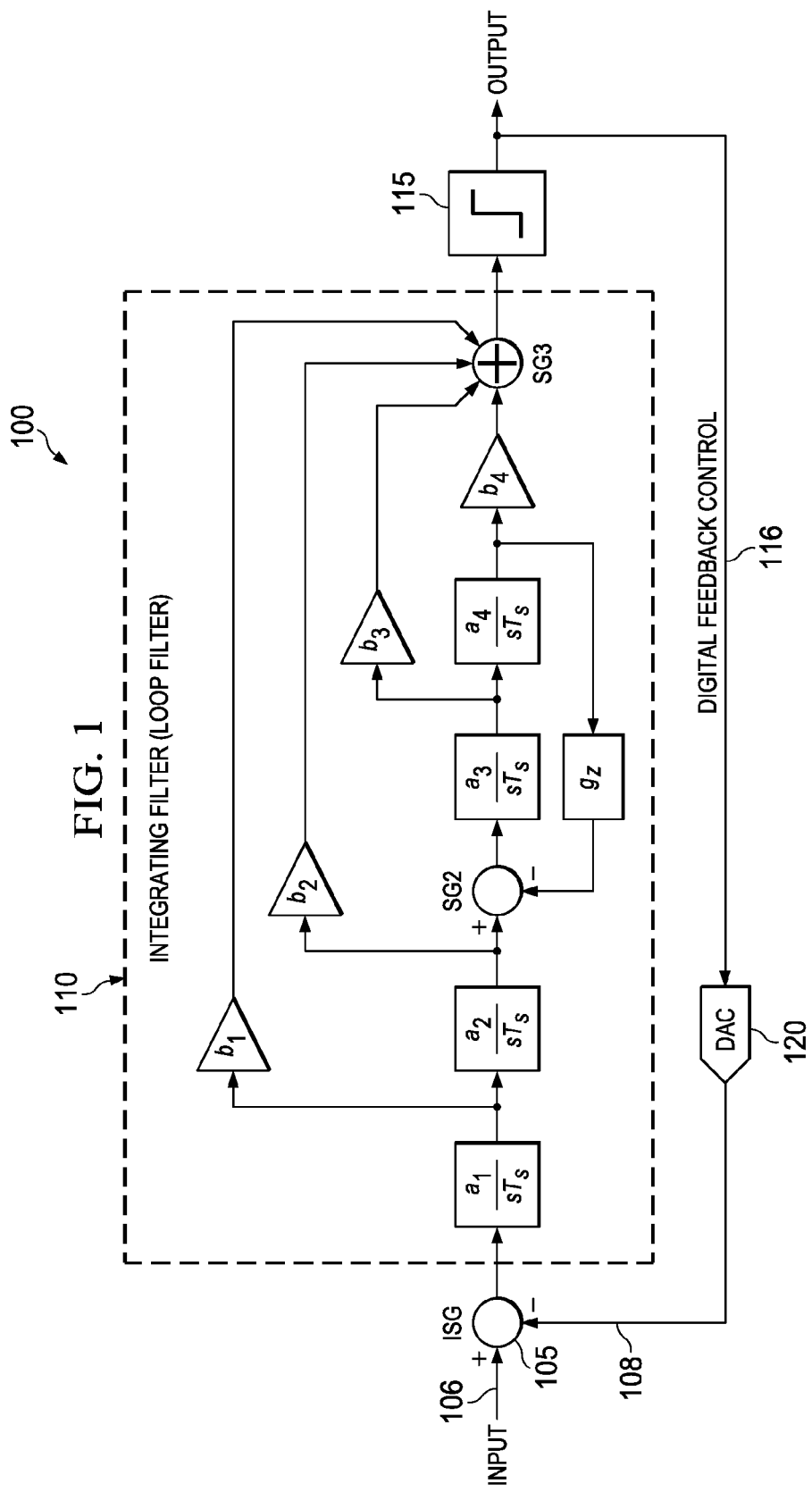
FIG. 1 illustrates a block diagram of an ADC based on sigma-delta conversion principles constructed according to the principles of the present disclosure.

FIG. 1 illustrates a block diagram of an ADC based on sigma-delta conversion principles, generally designated 100 and constructed according to the principles of the present disclosure. The block diagram of the ADC 100 is a simplified presentation, which is intended to be generally representative of and provide a general architecture for embodiments of the present disclosure. Embodiments of the present disclosure may be constructed to accommodate single input signals or differential input signal pairs. The ADC 100 includes an input summing junction (ISG) 105, an integrating filter (a loop filter) 110, a comparator (quantizer) 115 and a DAC 120.

An ADC input analog voltage is applied to a positive input 106 of the ISG 150, and a corresponding analog feedback voltage from the DAC 120 is provided to a negative input 108 of the ISG 105, resulting in an analog error signal being applied to the input of the integrating filter 110. The loop filter 110 is a cascade of integrators that may be implemented from active 1/RC blocks or Gm/C blocks.

Figure 2:
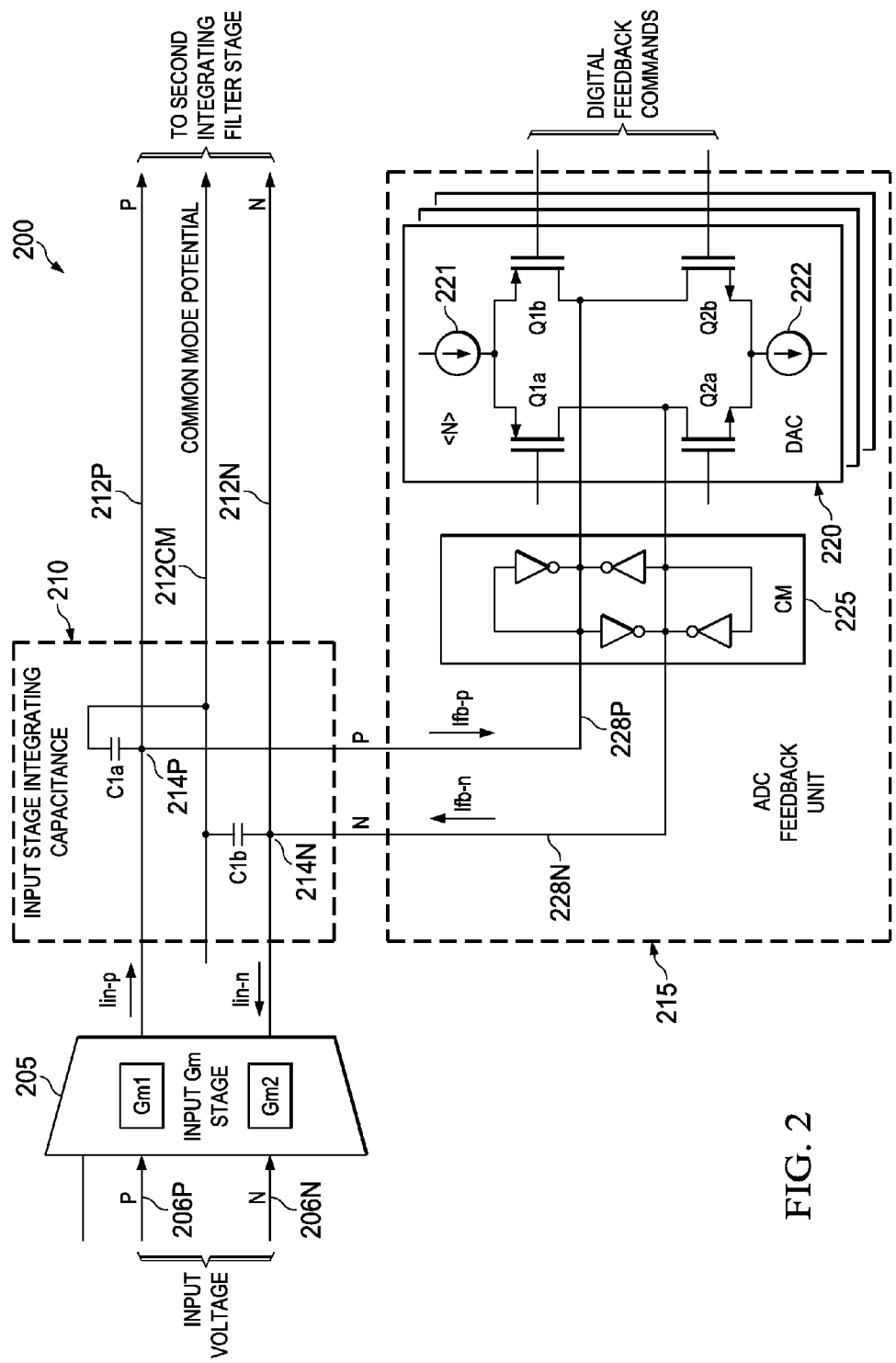
FIG. 2 illustrates another diagram of an embodiment of an ADC front end constructed according to the principles of the present disclosure.

FIG. 2 illustrates another diagram of an embodiment of an ADC front end, generally designated 200, constructed according to the principles of the present disclosure. The ADC front end 200 is representative of a differential embodiment of a sigma-delta ADC having positive (P) and negative (N) signal paths that correspond to a differential signal, which is balanced around a common mode potential.

The ADC front end 200 is an embodiment of the present disclosure that combines the functions represented by the input summing junction 105, the first stage of the integrating filter 110 and the DAC 120 of FIG. 1. The ADC front end 200 includes an input Gm stage 205 having differential voltage inputs 206P, 206N and corresponding differential response currents connected to positive and negative signal paths 212P, 212N.

The front end 200 also includes an input stage integrating capacitance 210 corresponding to a first stage of an integrating filter, as was generally shown with respect to FIG. 1. Here, the integrating capacitance 210 operates as a summing element for input and feedback related currents and consists of first and second capacitors C1a, C1b, that are respectively connected between the positive and negative signal paths 212P, 212N and a common mode path 212CM having a common mode potential. Operationally, the input and feedback related currents are out of phase and employ positive and negative current summing nodes 214P, 214N to provide an ADC error signal across the input stage integrating capacitance 210.

The front end 200 additionally includes an ADC feedback 215 having a sourcing and sinking current steering (SSCS) DAC 220 that is coupled to a common mode stage 225. The SSCS DAC 220 may generally consist of a family of bit cells (e.g., the three thermometer bit cells shown in FIG. 2, which is representative of a two binary bit DAC). Of course, the SSCS DAC 220 may consist of only one thermometer bit cell indicating a one binary bit DAC or contain seven thermometer bit cells representing a three binary bit DAC, as other examples.

Advantages of the SSCS DAC 220 include low power (no DC biasing, just the feedback current), low-noise (fewer noise contributors), small common mode perturbation (better P/N matching than small Gm cells), less quantization noise folding (greater output impedance) and minimum excess delay.

In any case, combined positive (P) and negative (N) differential voltage outputs 228P, 228N represent a parallel connection of all bit cells of the SSCS DAC 220 to the common mode stage 225 and the positive and negative signal paths 212P, 212N. The common mode stage 225 includes four inverting Gm stages connected as shown and maintains centering of the differential voltage outputs 228P, 228N around the common mode potential as the error voltage varies across the input stage integrating capacitance 210.

In one embodiment, weighting of each of the SSCS DAC 220 bit cells is equal wherein a same bit cell differential feedback current is provided to the total differential feedback current of the SSCS DAC 220, when a bit cell is activated by a digital feedback command. When the bit cell is not activated, it remains in an "internal current-balanced mode" and provides substantially no contribution to the total differential feedback current of the SSCS DAC 220. This action controls the magnitude of the total differential feedback current. Of course, the polarity of the total differential feedback current provided is in a direction to reduce the ADC error signal across the input stage integrating capacitance 210.

The illustrated bit cell of the SSCS DAC 220 is typical of all indicated bit cells and includes a sourcing current unit 221, a sinking current unit 222, a current sourcing switch pair Q1a, Q1b and a current sinking switch pair Q2a, Q2b connected as shown. The sourcing and sinking current units 221, 222 are balanced to provide substantially equal quiescent currents through branch switches Q1a, Q2a and Q1b, Q2b. In this implementation, the digital feedback commands interrupt this balance to provide a differential cell feedback current in a direction to reduce the effect of an input voltage, when required.

In the example of FIG. 2, current steering switch pair Q1a, Q2b are closed and current steering switch pair Q1b, Q2a are open. This condition provides at least a portion of total positive and negative feedback currents Ifb-p, Ifb-n in a direction to reduce an ADC error signal instigated by corresponding differential response input currents Iin-p, Iin-n. Of course, the positive and negative cell feedback currents Ifb-p, Ifb-n correspond to a total current from all contributing bit cells.

There are other implementation strategies that may be employed with the SSCS DAC 220. These implementation strategies include an arrangement wherein each bit cell is always providing a portion of the total positive and negative feedback currents Ifb-p, Ifb-n (i.e., one pair of the current steering switch pairs Q1a, Q2b or Q1b, Q2a is always closed in each bit cell). In this case, the digital feedback commands control the polarity of each bit cell differential feedback current such that the total feedback current has an appropriate magnitude and direction. To represent a zero feedback current condition in either of the above implementations, the digital feedback commands control the bit cells to provide total positive and negative feedback currents Ifb-p, Ifb-n corresponding to only one bit cell that alternates polarity.

Figure 3:
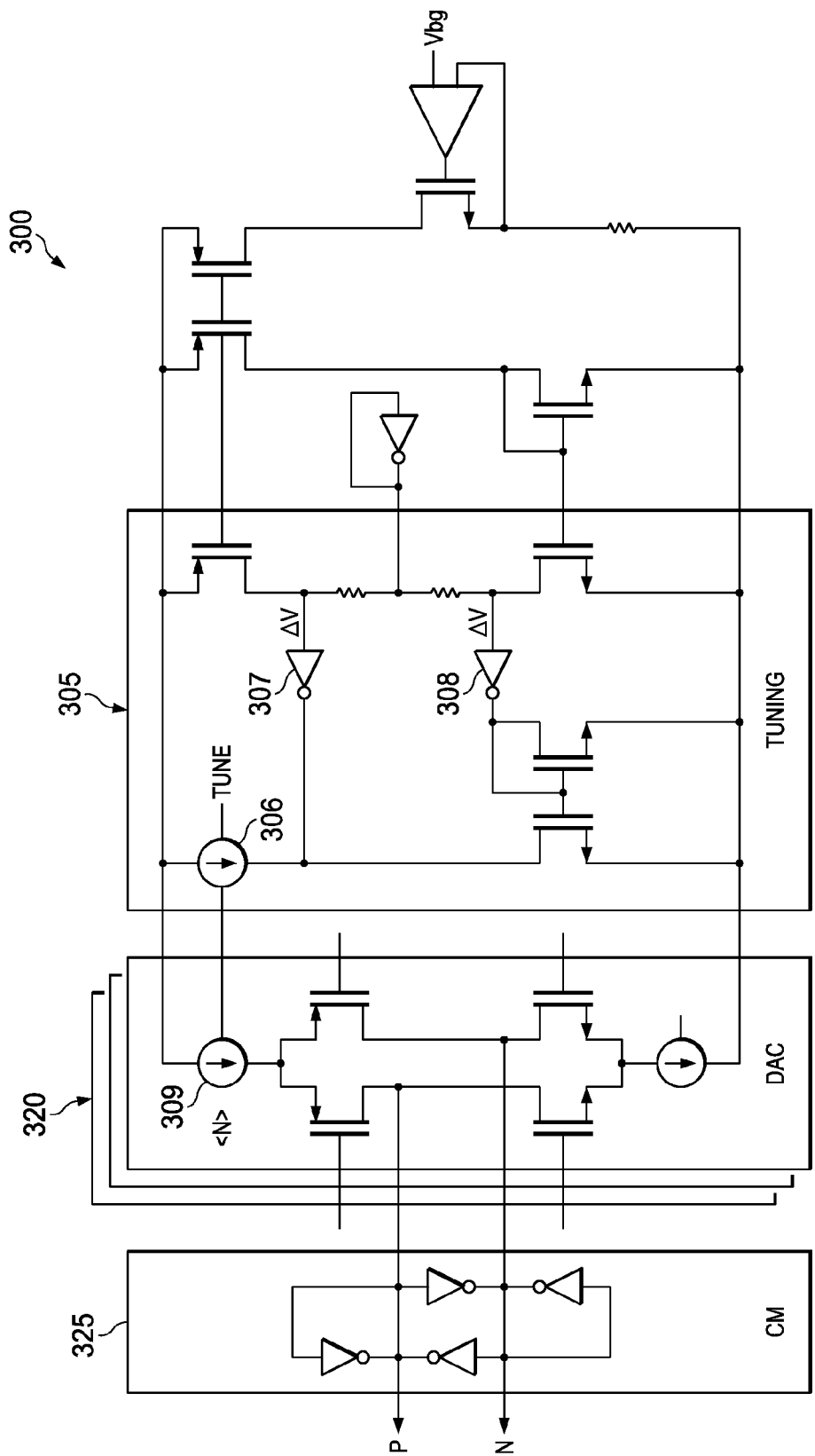
FIG. 3 illustrates a diagram of an embodiment of a tuning structure constructed according to principles of the present disclosure.

FIG. 3 illustrates a diagram of an embodiment of a tuning structure, generally designated 300, constructed according to principles of the present disclosure. The tuning structure 300 includes a tuning circuit 305 and a SSCS DAC 320 connected to a common mode stage 325 as may be employed in embodiments of continuous time sigma-delta ADCs previously discussed. As previously noted, some embodiments employing a continuous time sigma-delta ADC include a forward signal path having a loop filter and a quantizer and a feedback path having an SSCS DAC 320 and a common mode stage 325.

The loop filter is a cascade of integrators implemented from active 1/RC blocks or Gm/C blocks. In either of these cases, component effects corresponding to process, voltage and temperature (PVT) variations inherent to IC circuits will need to be overcome to avoid performance degradations that may include system instability. This may be achieved by trimming or tuning the components (e.g., R, C, Gm). In the case of a Gm/C loop filter, a possible implementation is to tune the Gm through its supply voltage to ensure a constant Gm/C value.

A current steering DAC with a digital input signal 'Tune' (shown in FIG. 3) provides an output current (I) 306, which is absorbed by replica Gm1 307 and Gm2 308 such that $\Delta V(Gm1+Gm2)=I$ (with $\Delta V$ being a copy of a fixed band gap value). A feedback loop (not shown) forces the supply voltage of Gm1 and Gm2 to ensure the previous equality.

The DAC code 'Tune' is set such that the frequency of a replica Gm/C based oscillator (not shown) matches the target value for the Gm/C ratio. Hence, using a copy current 309 of current (I) 306 for the main feedback DAC of the sigma-delta ADC will ensure that the feedback DAC current will track the input gm of the sigma-delta ADC, fixing the overall transfer function of the ADC to an optimum choice.

Figure 4:
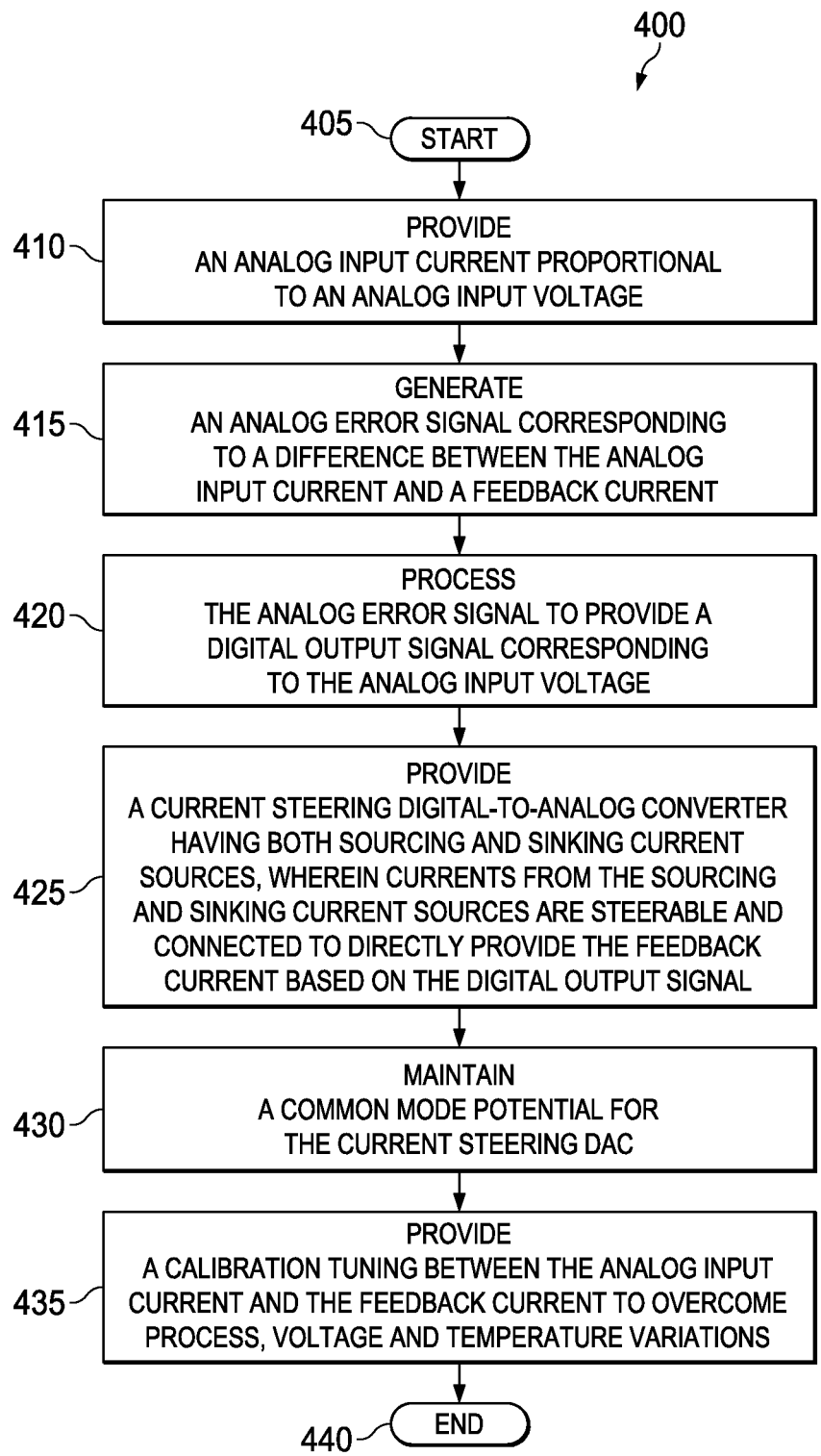
FIG. 4 illustrates a flow diagram of an embodiment of a sigma-delta ADC operating method carried out according to the principles of the present disclosure.

FIG. 4 illustrates a flow diagram of an embodiment of a sigma-delta ADC operating method, generally designated 400, carried out according to the principles of the present disclosure. The method 400 starts in a step 405, and an analog input current proportional to an analog input voltage is provided, in a step 410. Then, an analog error signal corresponding to a difference between the analog input current and a feedback current is generated, in a step 415. Generally, the analog error signal is selected from the group consisting of a single-ended error signal and a differential error signal. The analog error signal is processed to provide a digital output signal corresponding to the analog input voltage, in a step 420.

In a step 425, a current steering DAC having both sourcing and sinking current sources is provided, wherein currents from the sourcing and sinking current sources are steerable and connected to directly provide the feedback current based on the digital output signal. In one embodiment, the current steering DAC includes at least one current steering bit cell, and a total quantity of current steering bit cells is based on a required resolution of the analog error signal. In another embodiment, each current steering bit cell includes a pair of the sourcing and sinking current sources, and correspondingly, each current steering bit cell includes a pair of current steering switches that directs currents from the sourcing and sinking current sources to provide at least a portion of the feedback current.

In the illustrated embodiment, a common mode potential for the current steering DAC is maintained in a step 430, wherein maintaining the common mode potential employs four inverting transconductance cells connected to maintain the common mode potential. Additionally, in the illustrated embodiment, a calibration tuning between the analog input current and the feedback current to overcome process, voltage and temperature variations is provided, in a step 435. Here, the calibration tuning employs a current mirror structure for calibration between the analog input current and the feedback current. The process 400 ends in a step 440.

While the method disclosed herein has been described and shown with reference to particular steps performed in a particular order, it will be understood that these steps may be combined, subdivided, or reordered to form an equivalent method without departing from the teachings of the present disclosure. Accordingly, unless specifically indicated herein, the order or the grouping of the steps is not a limitation of the present disclosure.

Those skilled in the art to which this application relates will appreciate that other and further additions, deletions, substitutions and modifications may be made to the described embodiments.

What is claimed is:

1. A sigma-delta analog to digital converter, comprising:
    an input transconductance stage that provides an analog input current proportional to an analog input voltage;
    a current summing stage that generates an analog error signal corresponding to a difference between the analog input current and a feedback current;
    a forward signal path that processes the analog error signal to provide a digital output signal corresponding to the analog input voltage;
    a feedback path that includes a current steering digital-to-analog converter having both sourcing and sinking current sources, wherein currents provided by the sourcing and sinking current sources are steerable and connected to directly provide the feedback current based on the digital output signal; and
    a common mode stage in the feedback path that maintains a common mode potential for the current steering digital-to-analog converter, wherein the common mode stage employs four inverting transconductance cells that are connected to maintain the common mode potential.

2. The converter as recited in claim 1 wherein the current steering digital-to-analog converter includes at least one current steering bit cell.

3. The converter as recited in claim 2 wherein a total quantity of current steering bit cells is based on a resolution of the analog error signal.

4. The converter as recited in claim 2 wherein each current steering bit cell includes one pair of the sourcing and sinking current sources.

5. The converter as recited in claim 2 wherein each current steering bit cell includes a pair of current steering switches that directs currents from the sourcing and sinking current sources to provide at least a portion of the feedback current.

6. The converter as recited in claim 1 wherein the analog error signal is selected from the group consisting of:
    a single-ended error signal; and
    a differential error signal.

7. The converter as recited in claim 1 further comprising a tuning circuit that provides a current calibration between the input transconductance stage and the sourcing and sinking current sources of the current steering digital-to-analog converter to overcome process, voltage and temperature variations.

8. The converter as recited in claim 7 wherein the current calibration employs a current mirror structure between the input transconductance stage and the sourcing and sinking current sources of the current steering digital-to-analog converter.

9. A sigma-delta analog to digital converter operating method, comprising:
    providing an analog input current proportional to an analog input voltage;
    generating an analog error signal corresponding to a difference between the analog input current and a feedback current;
    processing the analog error signal to provide a digital output signal corresponding to the analog input voltage;
    providing a current steering digital-to-analog converter having both sourcing and sinking current sources, wherein currents from the sourcing and sinking current sources are steerable and connected to directly provide the feedback current based on the digital output signal; and
    maintaining a common mode potential for the current steering digital-to-analog converter, wherein the common mode potential is maintained by employing four connected inverting transconductance cells.

10. The method as recited in claim 9 wherein the current steering digital-to-analog converter includes at least one current steering bit cell.

11. The method as recited in claim 10 wherein a total quantity of current steering bit cells is based on a resolution of the analog error signal.

12. The method as recited in claim 10 wherein each current steering bit cell includes a pair of the sourcing and sinking current sources.

13. The method as recited in claim 10 wherein each current steering bit cell includes a pair of current steering switches that directs currents from the sourcing and sinking current sources to provide at least a portion of the feedback current.

14. The method as recited in claim 9 wherein the analog error signal is selected from the group consisting of:
    a single-ended error signal; and
    a differential error signal.

15. The method as recited in claim 9 further comprising providing a calibration tuning between the analog input current and the feedback current to overcome process, voltage and temperature variations.

16. The method as recited in claim 15 wherein the calibration tuning employs a current mirror structure for calibration between the analog input current and the feedback current.

* * * * *